(12) United States Patent
Struble et al.

(10) Patent No.: US 11,990,343 B2
(45) Date of Patent: May 21, 2024

(54) GATE METAL FORMATION ON GALLIUM NITRIDE OR ALUMINUM GALLIUM NITRIDE

(71) Applicant: MACOM Technology Solutions Holdings, Inc., Lowell, MA (US)

(72) Inventors: Wayne Mack Struble, Franklin, MA (US); Timothy Edward Boles, Tyngsboro, MA (US); Jason Matthew Barrett, Amherst, NH (US); John Stephen Atherton, Acton, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 475 days.

(21) Appl. No.: 17/288,190

(22) PCT Filed: Dec. 6, 2019

(86) PCT No.: PCT/US2019/064939
§ 371 (c)(1),
(2) Date: Apr. 23, 2021

(87) PCT Pub. No.: WO2020/118185
PCT Pub. Date: Jun. 11, 2020

(65) Prior Publication Data
US 2021/0407810 A1    Dec. 30, 2021

Related U.S. Application Data

(60) Provisional application No. 62/786,624, filed on Dec. 31, 2018, provisional application No. 62/776,711, filed on Dec. 7, 2018.

(51) Int. Cl.
*H01L 21/285* (2006.01)
*H01L 21/033* (2006.01)
(Continued)

(52) U.S. Cl.
CPC .... *H01L 21/28575* (2013.01); *H01L 21/0331* (2013.01); *H01L 29/2003* (2013.01); *H01L 29/401* (2013.01); *H01L 29/402* (2013.01)

(58) Field of Classification Search
None
See application file for complete search history.

(56) References Cited

U.S. PATENT DOCUMENTS

| 7,445,975 B2 | 11/2008 | Behammer |
| 7,569,869 B2 * | 8/2009 | Jin ...................... H01L 29/7843 257/190 |

(Continued)

FOREIGN PATENT DOCUMENTS

CN    103219239 B    5/2015

OTHER PUBLICATIONS

International Search Report for PCT/US2019/064939 dated Mar. 5, 2020.
(Continued)

*Primary Examiner* — Evren Seven
(74) *Attorney, Agent, or Firm* — Perilla Knox & Hildebrandt LLP; Jason M. Perilla (57) ABSTRACT

A method of manufacturing an electrode structure for a device, such as a GaN or AlGaN device is described. In one example, the method includes providing a substrate (212) of GaN or AlGaN with a surface region of the GaN or AlGaN exposed through an opening (216) in a layer of silicon nitride (214) formed on the substrate. The method further includes depositing layers of W (222), in one example, or Ni (220) and W (222), in another example, on the substrate and the layer of silicon nitride using reactive evaporation and photoresist layers (230) having an undercut profile for liftoff. The method further includes removing the photoresist layers having the undercut profile, and depositing layers of WN (Continued)

(224) and Al over the underlying layers of W or Ni and W by sputtering.

20 Claims, 7 Drawing Sheets (51) Int. Cl.
*H01L 29/20* (2006.01)
*H01L 29/40* (2006.01)

(56) References Cited

U.S. PATENT DOCUMENTS

| | | | | |
|---|---|---|---|---|
| 10,566,428 | B2* | 2/2020 | LaRoche | H01L 21/76877 |
| 2009/0078966 | A1* | 3/2009 | Asai | H01L 29/66462 |
| | | | | 257/690 |
| 2011/0227089 | A1* | 9/2011 | Mieczkowski | H01L 29/475 |
| | | | | 257/E27.068 |
| 2013/0126889 | A1* | 5/2013 | Bahl | H01L 29/66462 |
| | | | | 257/E21.403 |
| 2013/0248873 | A1* | 9/2013 | Kuraguchi | H01L 29/475 |
| | | | | 257/192 |
| 2014/0091322 | A1* | 4/2014 | Ishikura | H01L 29/66462 |
| | | | | 438/172 |
| 2015/0144961 | A1* | 5/2015 | Yoon | H01L 29/7786 |
| | | | | 257/77 |
| 2015/0325698 | A1* | 11/2015 | Theodorus Marinus Donkers | H01L 29/41725 |
| | | | | 438/572 |
| 2017/0104091 | A1* | 4/2017 | Tanaka | H01L 21/8252 |

OTHER PUBLICATIONS

Ho Kyu Jun et al: "Characteristics of a field plate connected to T-shaped gate in AlGaN/GaN HEMTs", Journal of the Korean Physical Society, Korean Physical Society, KR, vol. 67, No. 4, Sep. 4, 2015 (Sep. 4, 2015), pp. 682-686, XP035541221,ISSN: 0374-4884, DOI: 10.3938/JKPS.67.682[retrieved on Sep. 4, 2015] p. 1-p. 2; figure 1.

Lu et al., Electronics Letters, Stable AlGaN/GaN high electron mobility transistors with tungsten nitride gate metallisation, Dec. 3, 2009, vol. 45 No. 25.

Lu et al., Journal of Electronic Materials, Enhancement of the Schottky Barrier Height using a Nitrogen-Rich Tungsten Nitride Thin Film for the Schottky Contacts on AlGaN/GaN Heterostructures, 2008, vol. 37, No. 5, pp. 624-627.

Miura et al., Solid-State Electronics 48, Thermal annealing effects on Ni/Au based Schottky contacts on n-GaN and AlGaN/GaN with insertion of high work function metal, 2004, pp. 689-695.

Office Action in EP Application No. 19835339.3 dated May 5, 2023.

Ohmic Contacts PPT Presentation, Unknown Author, Publication Date Unknown (Jul. 11, 2010), University of South Carolina.

* cited by examiner

GATE METAL FORMATION ON GALLIUM NITRIDE OR ALUMINUM GALLIUM NITRIDE

CROSS-REFERENCE TO RELATED APPLICATIONS

This application is a 35 U.S.C. § 371 National Stage Patent Application of Patent Cooperation Treaty Application number PCT/US2019/064939, filed on Dec. 6, 2019, and titled "GATE METAL FORMATION ON GALLIUM NITRIDE OR ALUMINUM GALLIUM NITRIDE," which claims the benefit of priority to U.S. Provisional Application No. 62/776,711, filed Dec. 7, 2018, titled "TWO STEP GATE METAL FORMATION ON GALLIUM NITRIDE OR ALUMINUM GALLIUM NITRIDE," and the benefit of priority to U.S. Provisional Application No. 62/786,624, filed Dec. 31, 2018, titled "TWO STEP GATE METAL FORMATION ON GALLIUM NITRIDE OR ALUMINUM GALLIUM NITRIDE," the entire contents of both of which applications are hereby incorporated herein by reference.

BACKGROUND

Among other desirable characteristics, Gallium Nitride (GaN) devices offer high breakdown voltages, high electron mobility, and high saturation velocity. GaN devices are good candidates for high-power and high-temperature microwave applications. GaN devices are particularly suitable for microwave radio-frequency power amplifiers, including those used in high-speed wireless data transmission, and high-voltage switching devices for power conversion. GaN transistors maintain better performance at higher temperatures than Silicon transistors, because the large band gap of GaN transistors leads to a reduction in the generation of charge carriers inherent in semiconductors. Various types of GaN devices are being actively developed today.

SUMMARY

In one example, a method of manufacturing an electrode structure for a device includes forming an opening in a silicon nitride layer to expose a surface region of a substrate through the opening, forming a photoresist layer over the silicon nitride layer and around the opening in the silicon nitride layer, the photoresist layer comprising a mask opening, depositing a gate metal layer through the mask opening and onto the surface region of the substrate, removing the photoresist layer, and depositing a barrier metal layer over the gate metal layer and the silicon nitride layer.

In one aspect of the embodiments, depositing the gate metal layer includes depositing the gate metal layer using reactive evaporation. The gate metal layer can be embodied as at least one of nickel, tungsten, platinum, palladium, and tungsten nitride.

In another aspect of the embodiments, depositing the gate metal layer includes depositing a first gate metal layer using reactive evaporation, and depositing a second gate metal layer using reactive evaporation. In that example, the first gate metal layer can be nickel and the second gate metal layer can be tungsten.

In another aspect of the embodiments, depositing the barrier metal layer includes sputtering tungsten nitride over the gate metal layer, a top surface of the silicon nitride layer, and at least a portion of a step around the opening in the silicon nitride layer.

In still other aspects, the method further includes depositing a conductive metal layer on the barrier metal layer and depositing a cap metal layer on the conductive metal layer. The conductive metal layer can be embodied as aluminum, and the cap metal layer can be embodied as one of tungsten nitride, titanium nitride, and tungsten.

In still other aspects, the method further includes forming a cap etch photoresist mask over the cap metal layer, etching the cap metal layer, the conductive metal layer, the barrier metal layer, and the gate metal layer down to the silicon nitride layer around the cap etch photoresist mask, and removing the cap etch photoresist mask. In other aspects, the photoresist layer can be embodied as a first photoresist layer and a second photoresist layer, the second photoresist layer including an undercut profile for liftoff. The substrate can include a substrate of gallium nitride, aluminum gallium nitride, or a combination of gallium nitride and aluminum gallium nitride in various example embodiments.

In another example, a gate metal formation includes a silicon nitride layer comprising an opening in the silicon nitride layer that exposes a surface region of a substrate, the opening comprising a step around the opening, a gate metal layer on the surface region of the substrate and at least a portion of the silicon nitride layer, a barrier metal layer on the gate metal layer, on a top surface of the silicon nitride layer, and on at least a portion of the step around the opening in the silicon nitride layer, and a conductive metal layer on the barrier metal layer.

In one aspect, the gate metal layer can be deposited using reactive evaporation, and the barrier metal layer can be deposited using sputtering. The gate metal layer can be embodied as at least one of nickel, tungsten, platinum, palladium, and tungsten nitride in various examples. The gate metal layer can be embodied as a first gate metal layer and a second gate metal layer. In that example, the first gate metal layer can be embodied as nickel and the second gate metal layer can be embodied as tungsten. The barrier metal layer can be embodied as tungsten nitride in one example.

In other aspects, the gate metal formation can also include a cap metal layer on the conductive metal layer. The substrate can be embodied as a substrate of gallium nitride, aluminum gallium nitride, or a combination of gallium nitride and aluminum gallium nitride in various example embodiments. The gate metal formation can be embodied as a gate connected field plate (GCFP) formed on the substrate with a width of about 1.1 microns.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments.

DETAILED DESCRIPTION

As noted above, Gallium Nitride (GaN) devices offer high breakdown voltages, high electron mobility, and high saturation velocity. GaN devices are good candidates for high-power and high-temperature microwave applications. GaN devices are particularly suitable for microwave radio-frequency power amplifiers, including those used in high-speed wireless data transmission, and high-voltage switching devices for power conversion. GaN transistors maintain better performance at higher temperatures than Silicon transistors, because the large band gap of GaN transistors leads to a reduction in the generation of charge carriers inherent in semiconductors. Aluminum Gallium Nitride (AlGaN) devices also offer benefits similar to those of GaN devices. Thus, references herein to GaN substrates, structures, and devices can include AlGaN or both GaN and AlGaN substrates, structures, and devices.

In forming an electrode structure for a GaN device, a GaN substrate can be provided with a plasma-enhanced chemical vapor deposition (PECVD) silicon nitride layer (e.g. $Si_3N_4$ or $SiN_x$). Materials for the metal layers of the structure can be chosen for specified properties, such as barrier height, to optimize the performance of the resulting structure. For example, Schottky gate metal contacts on GaN or AlGaN can use high barrier height metals to form an electrode structure, such as an anode of a GaN or AlGaN Schottky diode, a Schottky gate contact in a GaN/AlGaN high electron mobility transistor (HEMT), or an electrode in another related type of device. As one example, platinum (Pt), nickel (Ni), palladium (Pd), gold (Au), tungsten nitride (WN), and tungsten (W) can have a high barrier height with lower leakage current and higher maximum current $I_{max}$. Gate metals such as Pt, Ni, and Pd can be deposited on GaN or AlGaN substrates using reactive evaporation, WN can be deposited using sputtering, and W can be deposited by either reactive evaporation or sputtering. Evaporation is generally preferred over sputtering to prevent crystal damage to GaN and AlGaN substrates.

In contrast, low barrier height metals, such as aluminum (Al), titanium (Ti), tantalum (Ta), chromium (Cr), indium (In), niobium (Nb), and silver (Ag), can cause high leakage current and lower maximum current $I_{max}$. These lower barrier height metals should be kept away from the surfaces of GaN and AlGaN, particularly at gate contacts. However, Al, Ti, and Ta can be used for ohmic contacts on GaN and can be deposited by either reactive evaporation or sputtering.

In the context outlined above, the embodiments described herein are directed to methods of manufacturing electrode structures for GaN and AlGaN high electron mobility transistor (HEMT) devices, among other types of devices. In one example, the method includes providing a substrate of GaN or AlGaN with a surface region of the GaN or AlGaN exposed through an opening in a layer of silicon nitride formed on the substrate. The method further includes depositing layers of W, in one example, or Ni and W, in another example, on the substrate and the layer of silicon nitride using reactive evaporation and photoresist layers having an undercut profile for liftoff. The method further includes removing the photoresist layers having the undercut profile, and depositing layers of WN and Al over the underlying layers of W or Ni and W by sputtering. These and other aspects of the embodiments are described in detail below. The embodiments also include GaN and AlGaN HEMT devices formed according to the method of manufacturing.

Figure 1:
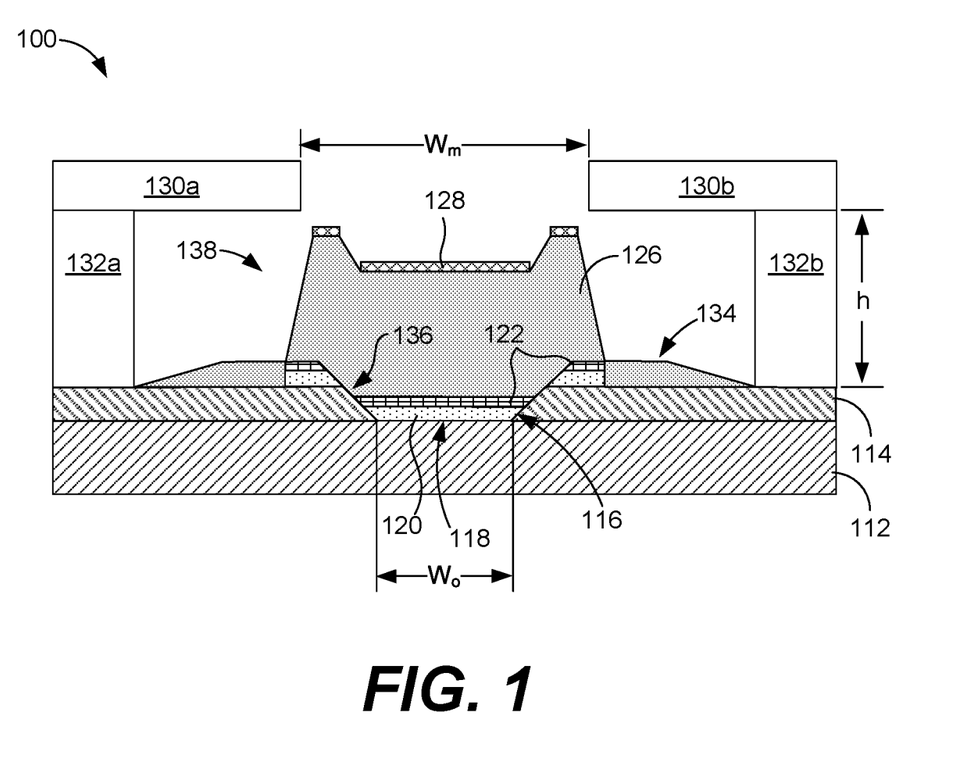
FIG. 1 illustrates an example electrode structure during a manufacturing process for a device using reactive evaporative liftoff of layers.

FIG. 1 illustrates an example electrode structure during a manufacturing process for a device 100 using reactive evaporative liftoff of layers. The device 100 can be embodied as a GaN HEMT device, as an AlGaN HEMT device, or other related devices, as examples, although the steps and processes described herein can be applied to other types of related devices. The device 100 is illustrated as a representative example in FIG. 1. The shapes and relative sizes of the various layers of the device 100 are not necessarily drawn to scale in FIG. 1. The layers shown in FIG. 1 are not exhaustive, and the device 100 can include other layers and elements not separately illustrated in some cases. Additionally, the device 100 can be formed as part of a larger integrated circuit device in combination with other devices and circuit elements.

In the example shown in FIG. 1, a GaN substrate 112 includes a silicon nitride layer 114 formed on a surface of the GaN substrate 112 using PECVD. A surface region 118 of the GaN substrate 112 is exposed through an opening 116 in the silicon nitride layer 114. At the process step illustrated in FIG. 1, reactive evaporation has been relied upon to deposit a nickel (Ni) layer 120 on the surface region 118 of the GaN substrate 112 through the opening 116 exposed through the silicon nitride layer 114. Reactive evaporation has also been relied upon to deposit a tantalum nitride (TaN) layer 122 on the Ni layer 120. Reactive evaporation has also been relied upon to deposit an aluminum (Al) layer 126 and a titanium nitride (TiN) layer 128, successively, over the TaN layer 122. A gate connected field plate (GCFP) 138 is formed by the layers 120, 122, 126, and 128. Alternatively, the GaN substrate 112 could be embodied as an AlGaN substrate or a substrate comprising both GaN and AlGaN layers, and similar layers of Ni, TaN, Al, and TiN could be deposited over those substrates.

Photoresist layers, including photoresist #1 layer sections 130a, 130b (collectively "photoresist layer 130") and photoresist #2 layer sections 132a, 132b (collectively "photoresist layer 132"), are shown in FIG. 1. The photoresist layer 130 includes a mask opening ($W_m$) between the photoresist #1 layer sections 130a and 130b, as shown in FIG. 1. The photoresist layers 130 and 132 are relied upon, to the extent possible, to control or limit the placement of the Ni layer 120, the TaN layer 122, the Al layer 126, and the TiN layer 128 during the reactive evaporation process steps.

The photoresist layer 132 can have a height (h) sufficient to allow all the layers that will be deposited with the reactive evaporative liftoff process. For example, the height (h) can be approximately 6000-7000 angstroms (Å). An undercut is relied upon in the profile of the two photoresist layers 130 and 132 to remove or lift off the photoresist layers in subsequent processing steps. Particularly, as shown in FIG. 1, the photoresist layer 130 extends over the photoresist layer 132, providing the undercut profile between the photoresist layers to remove or lift off the photoresist layers in subsequent processing steps.

Because of the undercut profile of the photoresist layers 130 and 132, the introduction of nitrogen (N), and the relatively high base pressure used during the reactive evaporation process steps, the placement of the Ni layer 120, the TaN layer 122, the Al layer 126, and the TiN layer 128 is less directional than desired. That is, the layers 120, 122, 126, and 128 are not formed directly and vertically below the mask opening $W_m$ in the photoresist layer 130. Thus, the use of reactive evaporation to deposit the layers 120, 122, 126, and 128 results in some directional scattering or lateral diffusion of material under the photoresist layer 130, resulting in the creation of tails 134 of the GCFP 138. The tails 134 essentially increase the lateral direction of the GCFP 138.

Additionally, the Ni layer 120 and the TaN layer 122 might not adequately cover the steps 136 formed in the silicon nitride layer 114, as shown in FIG. 1. That is, the Ni layer 120 and the TaN layer 122, which are deposited on the surface region 118 of the GaN substrate 112 within the opening 116 formed in the silicon nitride layer 114 (and in part on the silicon nitride layer 114), might not adequately cover the steps 136. This can lead to exposure of the GaN substrate 112, or an AlGaN substrate, with aluminum from the Al layer 126. New processing steps are described below to address the drawbacks that result from the processing steps described with reference to FIG. 1.

Figure 2A:
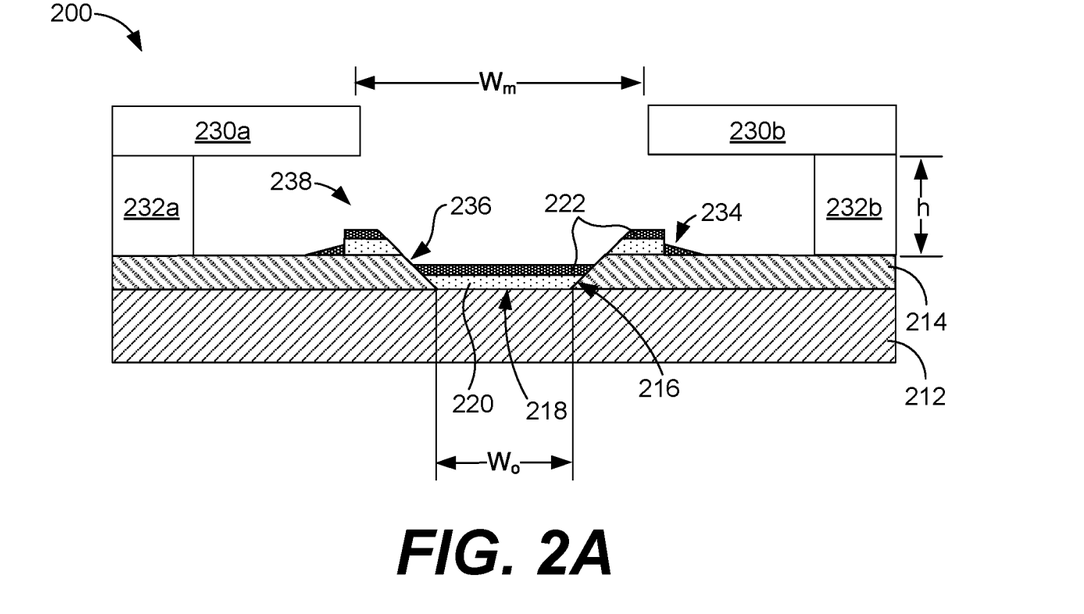
FIGS. 2A and 2B illustrate example electrode structures for devices during manufacturing process steps according to various embodiments described herein.
Figure 2B:
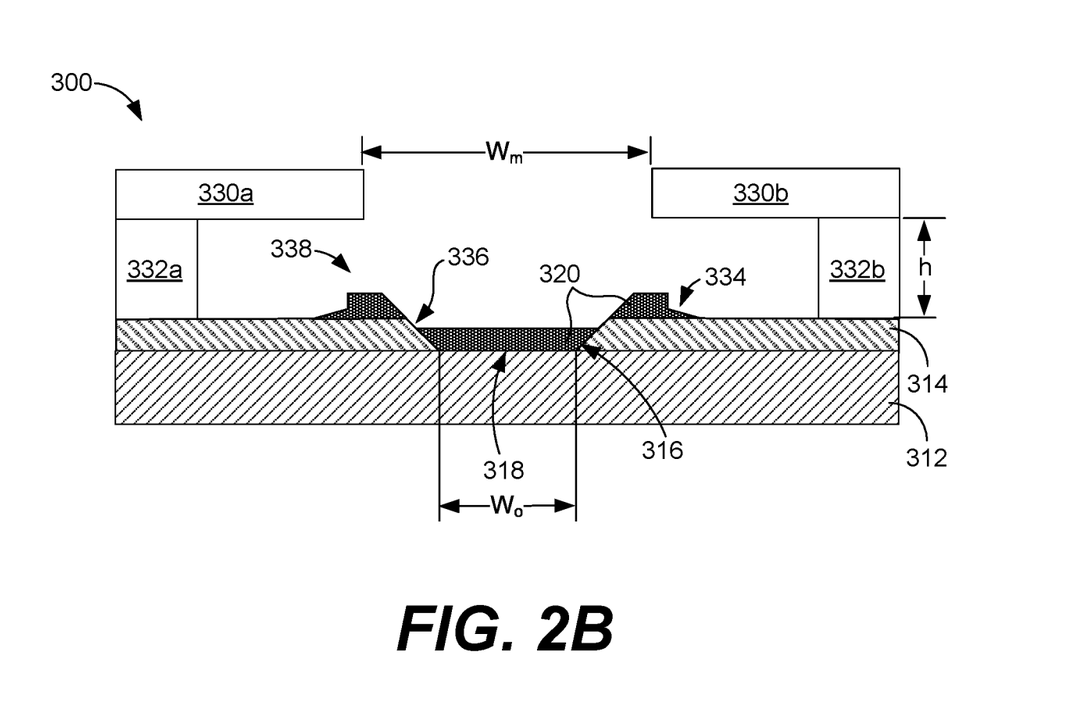

FIG. 2A illustrates an example electrode structure during a manufacturing process for a device 200, and FIG. 2B illustrates an example electrode structure during a manufacturing process for a device 300. The devices 200 and 300 can be embodied as GaN HEMT devices, as AlGaN HEMT devices, or as other related devices, as examples, although the steps and processes described herein can be applied to other types of related devices. The shapes and relative sizes of the various layers of the electrode structure are provided as examples and are not necessarily drawn to scale. The layers shown in FIGS. 2A and 2B are not exhaustive, and the electrode structure can include other (and substitute) layers and elements not separately illustrated. Additionally, the electrode structure can be formed as part of a larger integrated circuit device in combination with elements to form various devices.

The electrode structures for the devices 200 and 300 can form anodes of GaN or AlGaN Schottky diodes, a Schottky gate contact in a GaN or AlGaN transistor or HEMT, or an electrode in another type of device. In part, the electrode structures can be formed using a first step of reactive evaporative liftoff to deposit at least one gate metal, similar to that discussed above with reference to FIG. 1. Once a sufficient thickness of gate metal has been deposited to cover the regions of the GaN or AlGaN substrates exposed through the silicon nitride layer, a second step of metal deposition using sputtering can be used to deposit additional layers covering any discontinuities along the edges of the opening in the silicon nitride layer without damaging the GaN or AlGaN substrates, as described below.

Gate contacts on GaN or AlGaN, as shown in FIGS. 2A and 2B, generally require high barrier height metals, such as platinum (Pt), nickel (Ni), palladium (Pd), gold (Au), tungsten nitride (WN), or tungsten (W). However, in silicon foundries, Au is not permitted in the gate metal stack, as Au is a rapid diffuser in silicon. At the same time, low barrier height metals should be kept away from the surface of GaN and AlGaN substrates at gate contacts, as low barrier height metals can cause high leakage currents and lower transistor $I_{max}$. Higher barrier height metals, on the other hand, allow for lower leakage and higher $I_{max}$ currents.

Gate metals such as Pt, Ni, Pd, and W can be deposited on GaN and AlGaN substrates using reactive evaporation. Reactive evaporation is preferred over sputtering to reduce crystal damage to the surface of GaN and AlGaN substrates. While crystal damage to GaN and AlGaN substrates caused by sputtering can be repaired using a high temperature annealing step (e.g., >550° C. for 10 mins.), this annealing step can degrade the PECVD silicon nitride layer on the surfaces of the GaN and AlGaN substrates. In any case, Ni is preferred as a gate metal on GaN and AlGaN substrates over WN for better barrier height (e.g., Ni=1.37 eV, WN=1.21 eV).

As another factor for consideration, a low resistance is needed along the gate fingers to improve radio frequency (RF) transistor gain, so a high conductivity metal, such as Au or Al, should be layered on top of the gate metal to increase conductivity. However, if this high conductivity metal has a low barrier height on GaN or AlGaN, it can be necessary to add a barrier between the gate metal and the high conductivity metal. This prevents the high conductivity metal from reaching the surface of the GaN or AlGaN (e.g., by diffusing along grain boundaries of the gate metal under high temperature transistor operation).

In some cases, GaN and AlGaN HEMT devices produced in group III-V foundries use a gate metal stack of Ni/Au, Ni/Pd/Au, or Ni/Pt/Au deposited using evaporation. These metals all have a high barrier height on GaN and AlGaN, so there is no issue with high conductivity metal diffusion along the grain boundaries. In Silicon foundries, however, Au is not permitted in the gate metal stack, as Au is a rapid diffuser in Silicon, so Al is typically used as the high conductivity metal. Because Al is a low barrier height metal on GaN and AlGaN, a barrier layer should be used between the Ni gate metal layer and the Al layer. WN is a good choice for the barrier layer because WN has a high barrier height on GaN and AlGaN substrates, and the nitrogen in the WN fills the grain boundaries, preventing diffusion of Al to the surface of the GaN or AlGaN substrates when Al is formed over the WN layer.

Therefore, the embodiments described herein propose a hybrid gate metal approach for manufacturing in Silicon foundries using two processing steps to deposit the layers on the substrate. First, as shown in FIG. 2A, a gate metal layer comprising an Ni layer 220 and a W layer 222 are deposited on the substrate using reactive evaporation with photoresists in place, similar to the way described above with reference to FIG. 1. However, only the gate metal layer, which can comprise one or more layers of one or more gate metals, is deposited in this manner. Alternatively, as shown in FIG. 2B, a single W layer 320 can be deposited using reactive evaporation similar to the way described above with reference to FIG. 1, without depositing the layer of Ni. In later figures, FIGS. 3A, 4A, 5A, and 6A correspond to process steps that occur after the process step shown in FIG. 2A, and FIGS. 3B, 4B, 5B, and 6B correspond to process steps that occur in sequence after the process step shown in FIG. 2B.

In the example shown in FIG. 2A, a GaN substrate 212 includes a silicon nitride layer 214 formed on a surface of the GaN substrate 212 using PECVD. A surface region 218 of the GaN substrate 212 is exposed through an opening 216 of minimal width ($W_o$) in the silicon nitride layer 214. At the process step illustrated in FIG. 2A, reactive evaporation has been relied upon to deposit a Ni layer 220 on the surface region 218 of the GaN substrate 212. The Ni layer 220 is also deposited, in part, on the silicon nitride layer 214 around the opening 216. Reactive evaporation has also been relied upon to deposit a W layer 222 on the Ni layer 220. Alternatively, the GaN substrate 112 could be embodied as an AlGaN substrate or a substrate comprising both GaN and AlGaN layers, and similar layers of Ni and W could be deposited over those substrates.

Photoresist layers, including photoresist #1 layer sections 230a, 230b (collectively "photoresist layer 230") and photoresist #2 layer sections 232a, 232b (collectively "photoresist layer 232"), are shown in FIG. 2A. The photoresist layer 230 includes a mask opening ($W_m$) between the photoresist #1 layer sections 230a and 230b, as shown in FIG. 2A. The photoresist layers 230 and 232 are relied upon, to the extent possible, to control or limit the placement of the Ni layer 220 and the W layer 222, during the reactive evaporation process steps.

The W layer 222 can be relied upon to prevent the Ni layer 220 from oxidizing. Alternatively, a layer of Pt could also be used in place of the W layer 222 if permitted in the Silicon foundry. The use of reactive evaporation to deposit the Ni layer 220 and the W layer 222 results in some scattering or lateral diffusion under the photoresist layer 230, but the tails 234 of the GCFP 238 shown in FIG. 2A are smaller than the tails 134 of the GCFP 138 shown in FIG. 1. Because the deposited height of the Ni layer 220 and the W layer 222 is smaller than the total height of the fully GCFP 138 shown in FIG. 1, the photoresist layer 232 in FIG. 2A can be smaller in height (h) than that shown in FIG. 1, further reducing the tails 234.

In the example shown in FIG. 2B, a GaN substrate 312 includes a silicon nitride layer 314 formed on a surface of the GaN substrate 312 using PECVD. A surface region 318 of the GaN substrate 312 is exposed through an opening 316 of minimal width ($W_o$) in the silicon nitride layer 314. At the process step illustrated in FIG. 3A, reactive evaporation has been relied upon to deposit a single W layer 320 on the surface region 318 of the GaN substrate 312. Alternatively, the GaN substrate 312 could be embodied as an AlGaN substrate or a substrate comprising both GaN and AlGaN layers, and a similar layer W could be deposited over those substrates.

Photoresist layers, including photoresist #1 layer sections 330a, 330b (collectively "photoresist layer 330") and photoresist #2 layer sections 332a, 332b (collectively "photoresist layer 332"), are shown in FIG. 2B. The photoresist layer 330 includes a mask opening ($W_m$) between the photoresist #1 layer sections 330a and 330b, as shown in FIG. 2B. The photoresist layers 330 and 332 are relied upon, to the extent possible, to control or limit the placement of the W layer 320 during the reactive evaporation process steps. The use of reactive evaporation to deposit the W layer 320 results in some scattering or lateral diffusion under the photoresist layer 330, but the tails 334 of the GCFP 338 shown in FIG. 2B are smaller the tails 134 of the GCFP 138 shown in FIG. 1. Because the deposited height of the W layer 320 is smaller than the total height of the fully GCFP 138 shown in FIG. 1, the photoresist layer 332 in FIG. 2B can be smaller in height (h) than that shown in FIG. 1, further reducing the tails 334.

Figure 3A:
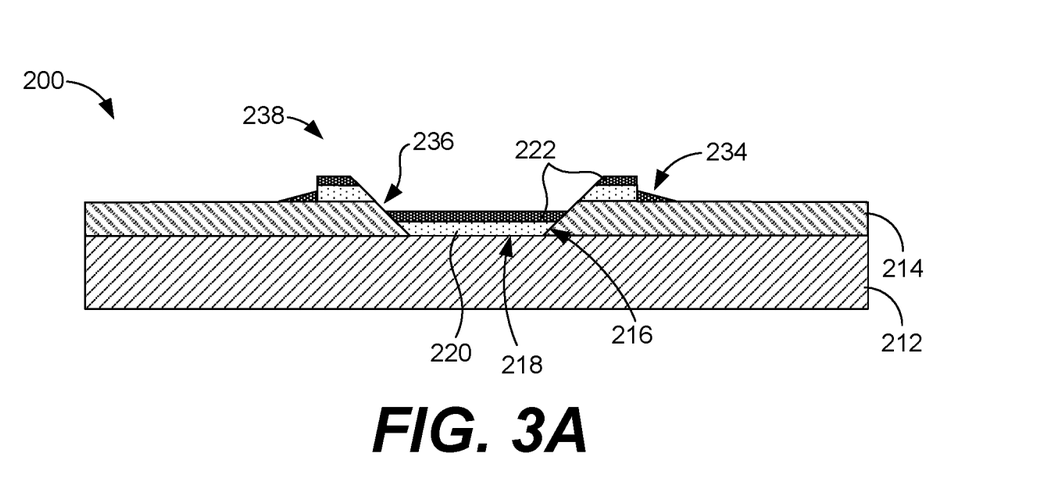
FIGS. 3A and 3B illustrate the example electrode structures with photoresist masks removed at a manufacturing process step after FIGS. 2A and 2B according to various embodiments described herein.
Figure 3B:
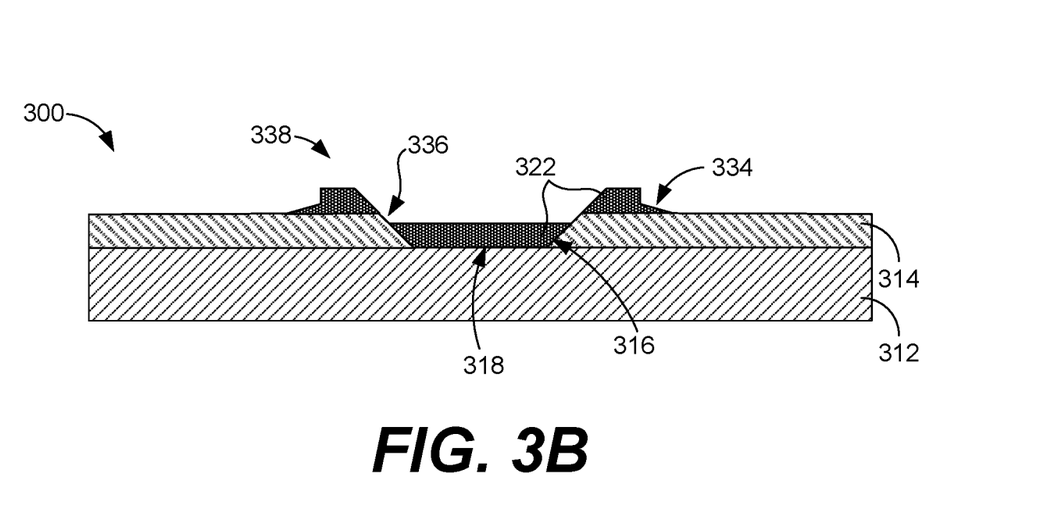

Turning to FIG. 3A, the photoresist layer 230 and photoresist the layer 232 are then stripped away as shown. As identified in FIG. 3A, the W layer 222 may not adequately cover the steps 236 of the silicon nitride layer 214, and a discontinuity in the Ni layer 220 and/or the W layer 222 can exist on the sidewall of the opening 216 of the silicon nitride layer 214. Similarly, turning to FIG. 3B, the photoresist layer 330 and photoresist the layer 332 are also stripped away as shown. As identified in FIG. 3B, the W layer 322 may not adequately cover the steps 336 of the silicon nitride layer 214, and a discontinuity in the W layer 322 can exist on the sidewall of the opening 316 of the silicon nitride layer 314.

Figure 4A:
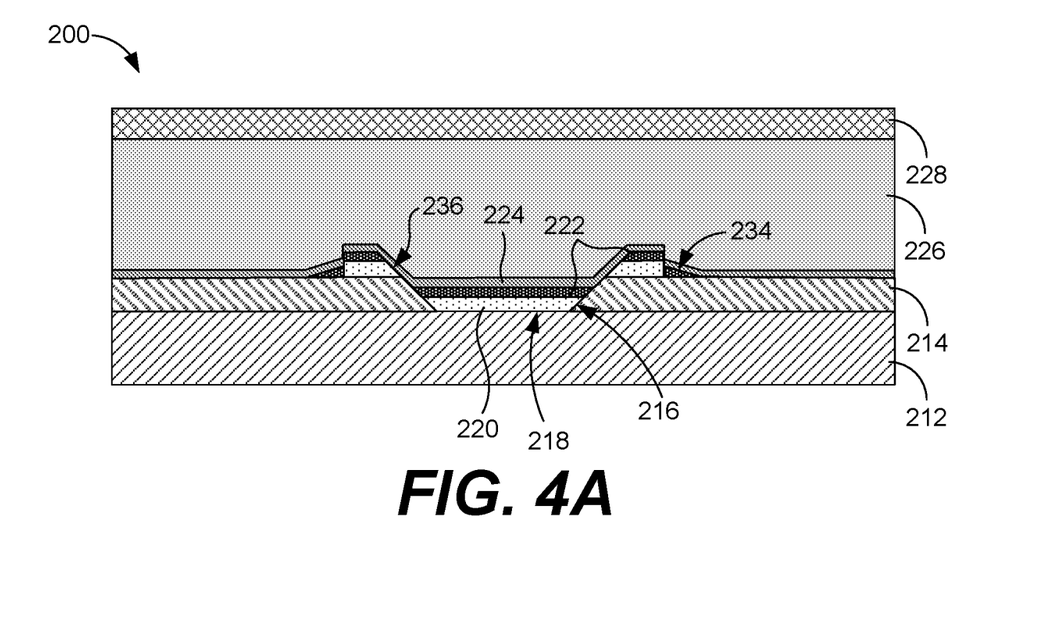
FIGS. 4A and 4B illustrate the example electrode structures after sputtering layers at a manufacturing process step after FIGS. 3A and 3B according to various embodiments described herein.

Turning to FIG. 4A, a WN barrier layer 224, an Al conductive layer 226, and a WN cap layer 228 are then sequentially formed by sputtering the respective metals on the entire surface of the device 200. As alternative combinations, layers of WN, Al, and TiN or WN, Al, and W can also be formed by sputtering the respective metals on the entire surface of the device 200. In any case, when the WN barrier layer 224 is formed, it adequately covers the steps 236 around the opening in the silicon nitride layer 214, as shown in FIG. 4A. The WN barrier layer 224 prevents the Al conductive layer 226 from reaching the surface of the GaN substrate 212 (e.g., by preventing diffusion along grain boundaries of the gate metal).

Figure 4B:
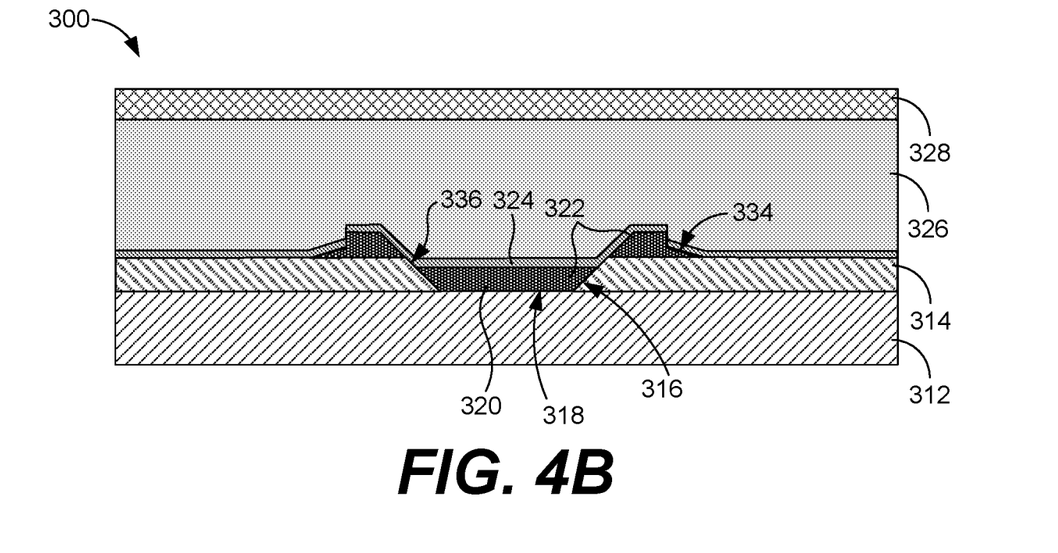

Turning to FIG. 4B, a WN barrier layer 324, an Al conductive layer 326, and a WN cap layer 328 are then sequentially formed by sputtering the respective metals on the entire surface of the device 300. As alternative combinations, layers of WN, Al, and TiN or WN, Al, and W can also be formed by sputtering the respective metals on the entire surface of the device 300. In any case, when the WN barrier layer 324 is formed, it adequately covers the steps 336 around the opening in the silicon nitride layer 314, as shown in FIG. 4B. The WN barrier layer 324 prevents the Al conductive layer 326 from reaching the surface of the GaN substrate 312 (e.g., by preventing diffusion along grain boundaries of the gate metal).

Figure 5A:
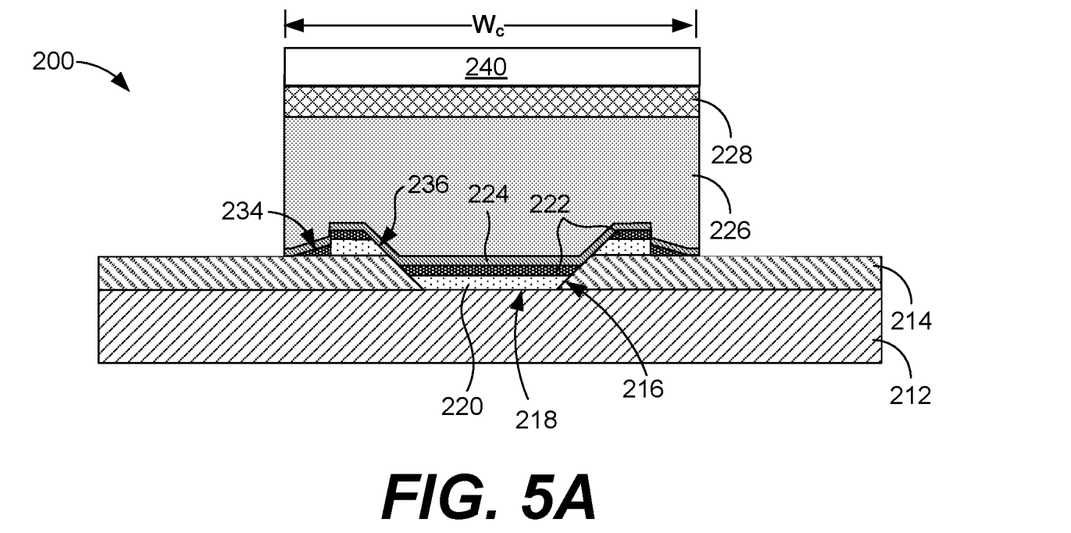
FIGS. 5A and 5B illustrate the example electrode structures with a cap photoresist in place at a manufacturing process step after FIGS. 4A and 4B according to various embodiments described herein.

Turning to FIG. 5A, the metal stack is then dry etched down to the silicon nitride layer 214 using a cap etch photoresist mask 240. The width ($W_c$) of the cap etch photoresist mask 240 can be larger than the mask opening ($W_m$) in the photoresist layer 230 in FIG. 2A. For example, the size of the mask opening ($W_m$) between the photoresist #1 layer sections 230a and 230b, as shown in FIG. 2A, can be about 0.9 μm, and size of the width ($W_c$) of the cap etch photoresist mask 240 can be 1.10 μm, for example, or larger in some cases. Thus, the width ($W_c$) of the cap etch photoresist mask 240 can be selected to completely cover the tails 234 of the evaporated metals. This process results in a good gate metal formation (e.g., from a barrier height perspective), and the Ni layer 220 and the W layer 222 act as a shield against sputter damage to the surface of the GaN substrate 212 when the WN barrier layer 224, Al conductive layer 226, and WN cap layer 228 are sputtered on top.

Figure 5B:
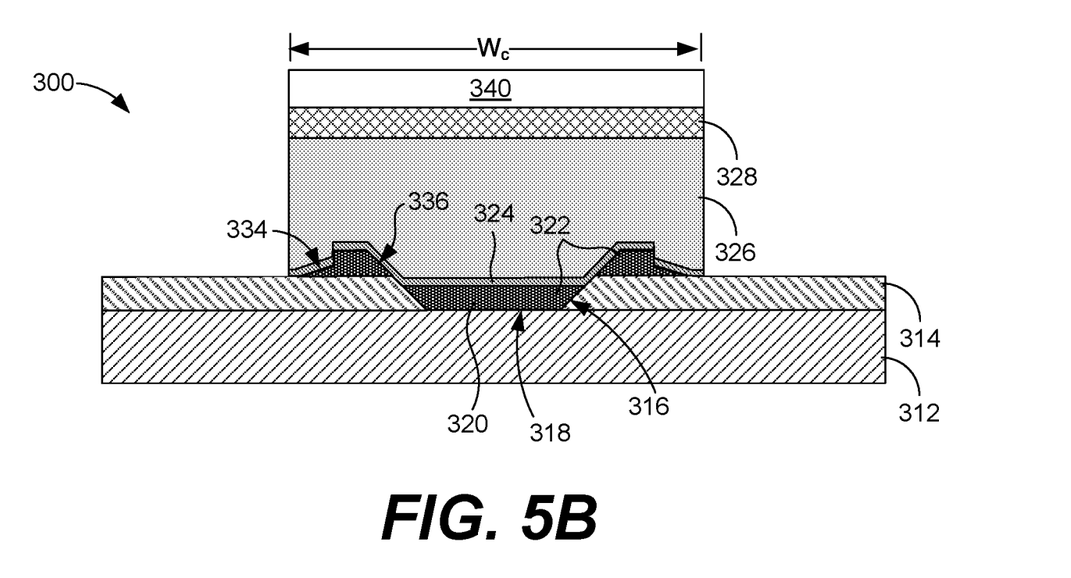

Turning to FIG. 5B, the metal stack is then dry etched down to the silicon nitride layer 314 using a cap etch photoresist mask 340. The width ($W_c$) of the cap etch photoresist mask 340 can be larger than the mask opening ($W_m$) in the photoresist layer 330 in FIG. 2B. For example, the size of the mask opening ($W_m$) between the photoresist #1 layer sections 330a and 330b, as shown in FIG. 2B, can be about 0.9 μm, and size of the width ($W_c$) of the cap etch photoresist mask 340 can be 1.10 μm, for example, or larger in some cases. Thus, the width ($W_c$) of the cap etch photoresist mask 340 can be selected to completely cover the tails 334 of the evaporated metals. This process results in a good gate metal formation (e.g., from a barrier height perspective), and the W layer 320 acts as a shield against sputter damage to the surface of the GaN substrate 212 when the WN barrier layer 324, Al conductive layer 326, and WN cap layer 328 are sputtered on top.

Figure 6A:
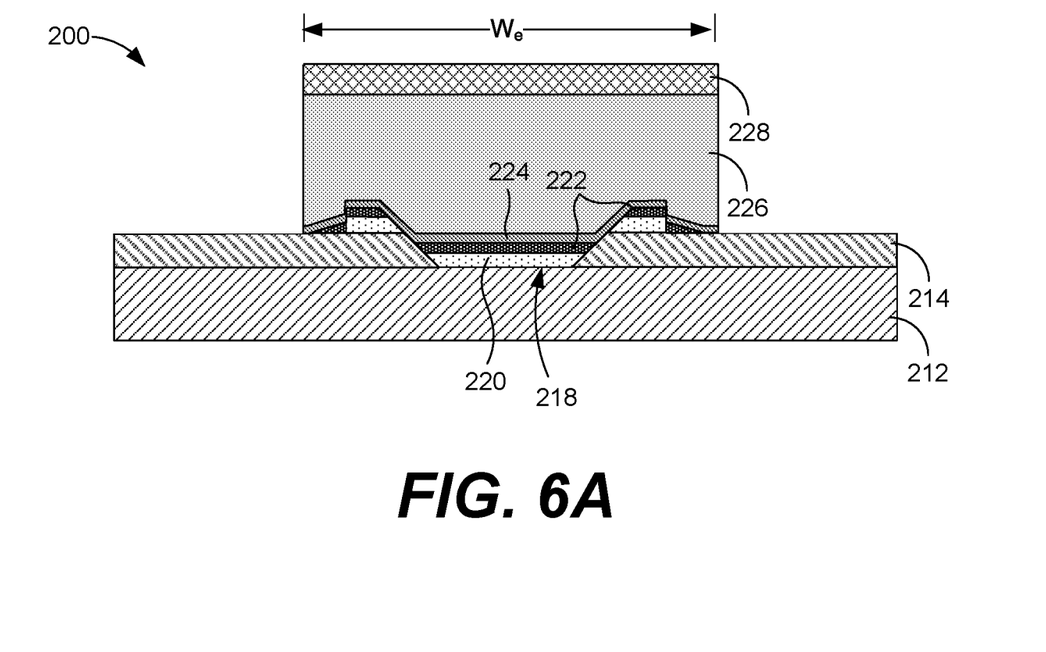
FIGS. 6A and 6B illustrate the final electrode structures for the devices according to various embodiments described herein.

FIG. 6A illustrates a final electrode structure for the device 200 according to various embodiments described herein. The cap etch photoresist mask 240 has been removed in FIG. 6A. In FIG. 6A, the height of each layer can range in thickness from about 900-1025 Å for the silicon nitride layer 214, from about 300-500 Å for the Ni layer 220, from about 60-110 Å for the W layer 222, from about 200-500 Å for the WN barrier layer 224, from about 5800-6200 Å for the Al conductive layer 226, and from about 80-110 Å for the WN cap layer 228. These vertical height ranges may be preferred, but the dimensions of the metal layers can vary in some cases and for some applications. The width (We) of the electrode can be between about 1.1-1.2 µm, for example.

Figure 6B:
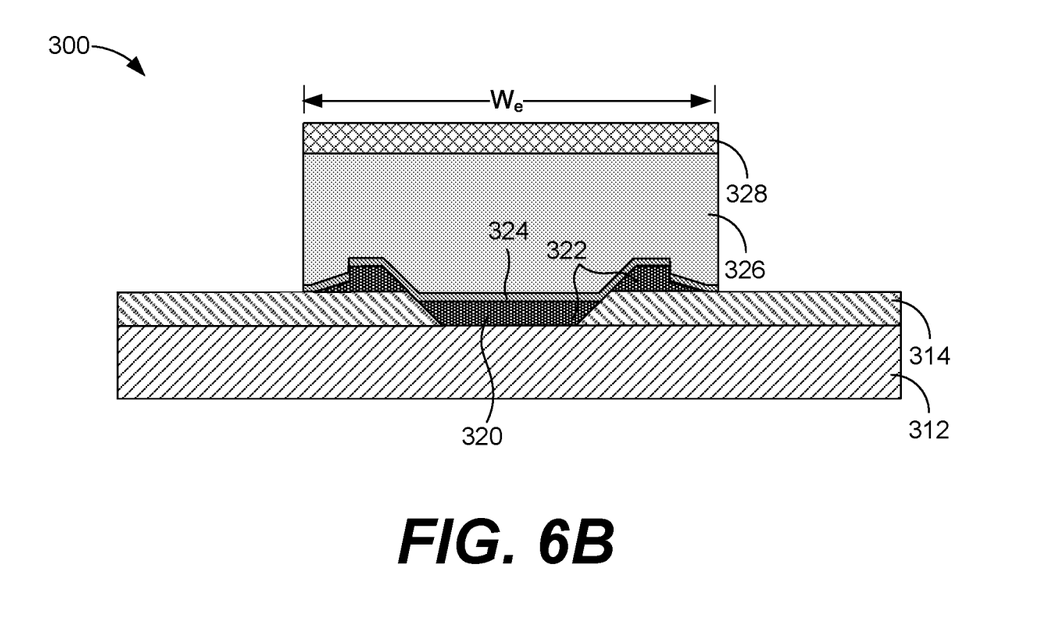

FIG. 6B illustrates a final electrode structure for the device 300 according to various embodiments described herein. The cap etch photoresist mask 340 has been removed in FIG. 6B. In FIG. 6B, the height of each layer, can range in thickness from about 900-1025 Å for the silicon nitride layer 314, from about 100-200 Å for the W layer 320, from about 200-500 Å for the WN barrier layer 324, from about 5800-6200 Å for the Al conductive layer 326, and from about 80-110 Å for the WN cap layer 328. These vertical height ranges may be preferred, but the dimensions of the metal layers can vary in some cases and for some applications. The width (We) of the electrode can be between about 1.1-1.2 µm, for example.

Figure 7:
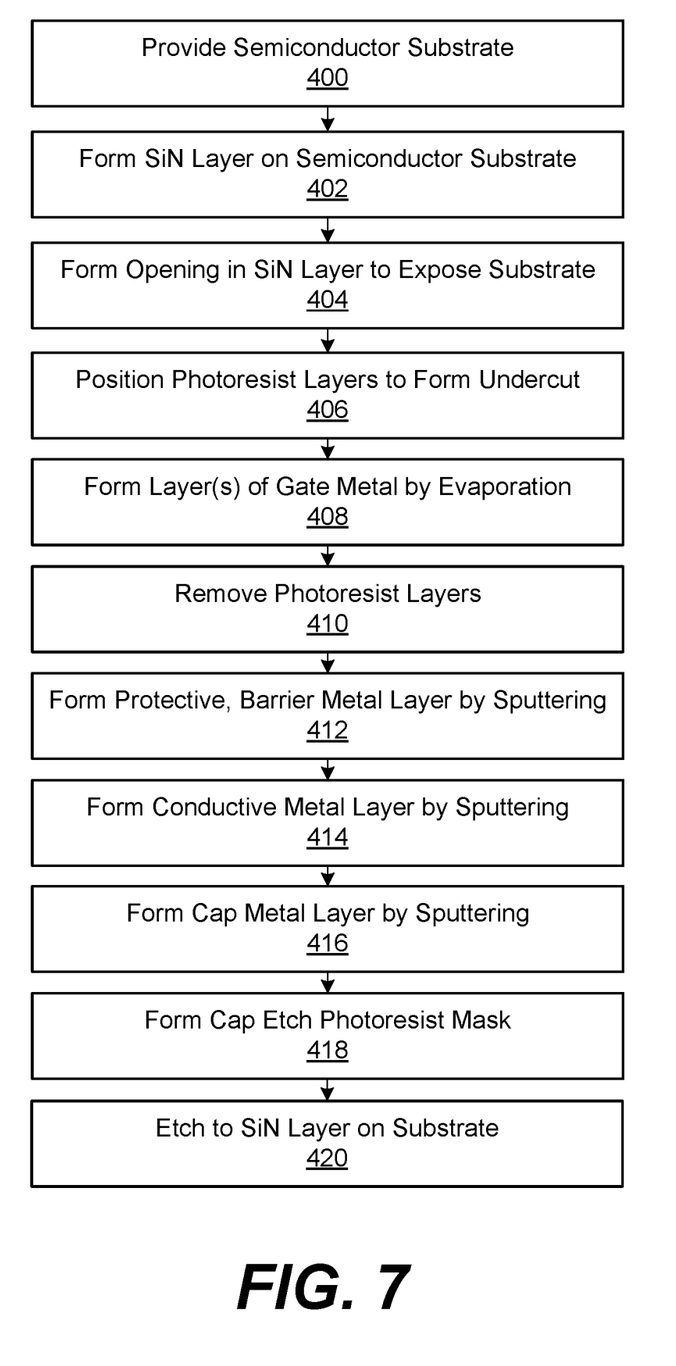
FIG. 7 illustrates an example method of forming the electrode structures shown in FIGS. 6A and 6B according to various embodiments described herein.

FIG. 7 illustrates an example method of forming the electrode structures shown in FIGS. 6A and 6B according to various embodiments described herein. Although the method illustrates a specific order of steps in FIG. 7, the order of the steps can differ from that which is depicted. For example, an order of two or more steps can be scrambled relative to the order shown in some cases. Also, two or more steps shown in succession can be performed, at least in part, at the same time. In some cases, one or more of the steps can be skipped or omitted. In other cases, additional steps not shown in FIG. 7 can be relied upon, such as steps among or after the steps shown in FIG. 7.

At step 400, the process includes providing or forming a semiconductor substrate, such as the GaN substrate 212 shown in FIG. 2A or the GAN substrate 312 shown in FIG. 2B. The GaN substrate 212 can be sourced from a vendor or formed using a Hydride Vapor Phase Epitaxy (HVPE) method, for example. Alternatively, the substrate provided at step 400 can also be embodied as an AlGaN substrate or a substrate with a combination of GaN and AlGaN substrate layers. For example, the substrate can be a multilayered structure including layers of GaN and AlGaN.

At step 402, the process includes forming a layer of silicon nitride on a top surface of the substrate provided at step 400. The silicon nitride layer can be formed on the top surface of the substrate using PECVD, although any suitable method can be used. For example, the silicon nitride layer 214 can be formed on the GaN substrate 212 shown in FIG. 2A, or the silicon nitride layer 314 can be formed on the GaN substrate 312 shown in FIG. 2B. Alternatively, the silicon nitride layer can also be formed at step 402 on an AlGaN substrate or a substrate with a combination of GaN and AlGaN substrate layers.

At step 404, the process includes forming an opening in the layer of silicon nitride formed at step 402. For example, the opening 216 can be formed in the silicon nitride layer 214 shown in FIG. 2A. As another example, the opening 316 can be formed in the silicon nitride layer 314 shown in FIG. 2B. In either case, step 404 can result in the exposure of the surface regions 218 and 318 the GaN substrates 212 and 312. The openings 216 and 316 can have a width ($W_o$) at the top surface of the GaN substrates 212 and 312. As an example, the width ($W_o$) of the openings 216 and 316 can be 0.5 µm. The openings 216 and 316 can be formed by etching a trench in the silicon nitride layers 214 and 314 or by using another suitable technique. The walls of the openings 216 and 316 may be tapered or angled as shown in FIGS. 2A and 2B and discussed above.

At step 406, the process includes forming one or more layers of photoresist. For example, the photoresist layers 230 and 232 shown in FIG. 2A can be formed, with the photoresist layer 230 including a mask opening ($W_m$) between the photoresist #1 layer sections 130a and 130b. The photoresist layer 232 can be formed to a vertical height (h) as shown in FIG. 2A, allowing photoresist layer 230 to be positioned on top of the photoresist layer 232 with an overhang. The height (h) is configured to allow lift off of the evaporated materials deposited on the substrate in subsequent steps. A size of the mask opening ($W_m$) in FIG. 2A can be greater than the width ($W_o$) of the opening 216 at the surface of the GaN substrate 212. In one example, the width ($W_o$) of the opening 216 can be 0.5 µm, and the width of the mask opening ($W_m$) can be 0.9 µm.

As another example, the photoresist layers 330 and 332 shown in FIG. 2B can be formed, with the photoresist layer 330 including a mask opening ($W_m$) between the photoresist #1 layer sections 330a and 330b. The photoresist layer 332 can be formed to a vertical height (h) as shown in FIG. 2B, allowing photoresist layer 330 to be positioned on top of the photoresist layer 332 with an overhang. The height (h) is configured to allow lift off of the evaporated materials deposited on the substrate in subsequent steps. A size of the mask opening ($W_m$) in FIG. 2B can be greater than the width ($W_o$) of the opening 316 at the surface of the GaN substrate 312. In one example, the width ($W_o$) of the opening 316 can be 0.5 µm, and the width of the mask opening ($W_m$) can be 0.9 µm.

At step 408, the process includes forming or depositing at least one layer of at least one gate metal on the surface of the substrate provided at step 400, through the opening in the silicon nitride layer formed at step 404. Reactive evaporation can be used at step 408 for directional depositing of the gate metal(s) through the photoresist openings 216 and 316, for example.

With reference to the example shown in FIG. 2A, step 408 can include forming or depositing a first gate metal layer on the surface of the substrate and, in part, on the silicon nitride layer using reactive evaporation. For example, the first gate metal can be Ni, to form the Ni layer 220, at a thickness ranging from about 300-500 Å. In other examples, the first gate metal can be Pt, Pd, or WN. Step 408 can also include forming or depositing a second gate metal layer over the first gate metal layer. For example, the second gate metal can be W, to form the W layer 222, at a thickness ranging from about 100-200 Å. Although there may be discontinuities along the edges of the opening 216, the surface region 218 of the GaN substrate 212 can be covered at step 408.

Alternatively, with reference to the example shown in FIG. 2B, step 408 can include forming or depositing a single gate metal layer on the surface of the substrate and, in part, on the silicon nitride layer using reactive evaporation. For example, the single gate metal can be W, to form the W layer 320, at a thickness ranging from about 100-200 Å, although other gate metals can be deposited at other thicknesses. In other examples, the single gate metal can be Pt, Pd, or WN. Although there may be discontinuities along the edges of the opening 316, the surface region 318 of the GaN substrate 312 can be covered at step 408.

At step 410, the process includes removing the photoresist layers formed at step 406. For example the photoresist layers 230 and 232 in FIG. 2A can be removed, or the photoresist layers 330 and 332 in FIG. 2B can be removed, to allow access to the partially layered substrates. The photoresist layers can be removed using any suitable stripping technique, with or without the use of a solvent, using either wet or dry stripping techniques, depending upon the type of photoresist layers formed at step 406.

At step 412, the process includes forming or depositing a protective, barrier metal layer of metal by sputtering. For example, a layer of WN can be sputtered at step 412. In FIG. 2A, the WN barrier layer 224 is sputtered to cover the W layer 222 and surface portions of the silicon nitride layer 214 which remain exposed. In FIG. 2B, the WN barrier layer 324 is sputtered to cover the W layer 322 and surface portions of the silicon nitride layer 314 which remain exposed. Once a sufficient thickness of at least one gate metal, such as the layer of WN, has been formed at step 412, additional layers of metal can be sputtered in subsequent steps without damaging the underlying substrate as described above. The WN barrier layer 224 can be deposited a thickness from about 200-500 Å, although other ranges can be relied upon.

At step 414, the process includes forming or depositing a conductive metal layer on the barrier layer of metal. For example, the Al conductive layer 226 shown in FIG. 4A or the Al conductive layer 326 shown in FIG. 4B can be formed at step 414, by sputtering. The conductive layers 226 and 326 can cover the barrier layers 224 and 324 completely, as discussed above and shown in FIGS. 4A and 4B. As an example, the conductive layers can be aluminum with a thickness from about 5800-6200 Å.

At step 416, the process includes forming or depositing a cap metal layer on the conductive metal layer. For example, the WN cap layer 228 shown in FIG. 4A or the WN cap layer 328 shown in FIG. 4B can be formed at step 416, by sputtering. The cap metal layers 228 and 328 can cover the conductive layers 226 and 326 completely, as discussed above and shown in FIGS. 4A and 4B. As an example, the cap metal layers can comprise WN with a thickness from about 80-110 Å.

As one alternative, steps 412, 414, and 416 can include forming or depositing layers of WN, Al, and TiN, in turn, by sputtering. As another alternative, steps 412, 414, and 416 can also include forming or depositing layers of WN, Al, and W, in turn, by sputtering.

At step 418, the process includes forming a cap etch photoresist mask, such as the cap etch photoresist masks 240 and 340 shown in FIGS. 5A and 5B. The cap etch photoresist masks 240, 340 can be configured with a width ($W_c$) to include the width of the GCFPs including the tails 234 and 334 formed during the reactive evaporation process steps. The width ($W_c$) can be about 1.1-1.2 µm, for example, slightly wider than the example photoresist opening width ($W_m$) of 0.9 µm. At step 420, the process includes etching the layers to the silicon nitrate layer formed at step 402, leaving the structure under the cap etch photoresist mask formed at step 418. Step 420 can also include removing the cap etch photoresist mask formed at step 418 to arrive at the devices 200 and 300 shown in FIGS. 6A and 6B, respectively.

Thus, the embodiments described herein encompass a method of forming gate metal contacts in Silicon foundries using two processing steps to deposit the metal layers on a substrate. In one example, a gate metal layer comprising an Ni layer and a W layer are deposited on the substrate using reactive evaporation with photoresist layers in place. However, only the gate metal layers are deposited in this manner using reactive evaporation. Alternatively, a single W layer can be deposited using reactive evaporation. Later, after the photoresist layers have been removed, additional protective, conductive, and cap metal layers are deposited by sputtering.

The structures and methods described herein can be used to fabricate a wide variety of useful integrated circuits. For example, the electrodes described above can be integrated with various components in a monolithic circuit format suitable for microwave circuit applications. Although embodiments have been described herein in detail, the descriptions are by way of example.

The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A method of manufacturing an electrode structure for a device, comprising:
    forming an opening in a silicon nitride layer to expose a surface region of a substrate through the opening;
    forming a photoresist layer over the silicon nitride layer and around the opening in the silicon nitride layer, the photoresist layer comprising a mask opening;
    depositing a gate metal layer through the mask opening and onto the surface region of the substrate;
    removing the photoresist layer; and
    depositing a barrier metal layer over the gate metal layer and the silicon nitride layer.

2. The method according to claim 1, wherein depositing the gate metal layer comprises depositing the gate metal layer using reactive evaporation.

3. The method according to claim 1, wherein the gate metal layer comprises at least one of nickel, tungsten, platinum, palladium, and tungsten nitride.

4. The method according to claim 1, wherein depositing the gate metal layer comprises:
    depositing a first gate metal layer using reactive evaporation; and
    depositing a second gate metal layer using reactive evaporation.

5. The method of claim 4, wherein the first gate metal layer is nickel and the second gate metal layer is tungsten.

6. The method according to claim 1, wherein depositing the barrier metal layer comprises sputtering tungsten nitride over the gate metal layer, a top surface of the silicon nitride layer, and at least a portion of a step around the opening in the silicon nitride layer.

7. The method according to claim 1, further comprising:
    depositing a conductive metal layer on the barrier metal layer; and
    depositing a cap metal layer on the conductive metal layer.

8. The method according to claim 7, wherein the conductive metal layer comprises aluminum, and the cap metal layer comprises one of tungsten nitride, titanium nitride, and tungsten.

9. The method of claim 7, further comprising:
    forming a cap etch photoresist mask over the cap metal layer;

etching the cap metal layer, the conductive metal layer, the barrier metal layer, and the gate metal layer down to the silicon nitride layer around the cap etch photoresist mask; and removing the cap etch photoresist mask.

10. The method according to claim 1, wherein the photoresist layer comprises a first photoresist layer and a second photoresist layer, the second photoresist layer comprising an undercut profile for liftoff.

11. The method according to claim 1, wherein the substrate comprises a substrate of gallium nitride, aluminum gallium nitride, or a combination of gallium nitride and aluminum gallium nitride.

12. A gate metal formation, comprising:
- a silicon nitride layer comprising an opening in the silicon nitride layer that exposes a surface region of a substrate, the opening comprising a step around the opening;
- a gate metal layer on the surface region of the substrate and at least a portion of the silicon nitride layer;
- a barrier metal layer on the gate metal layer, on a top surface of the silicon nitride layer, and on at least a portion of the step around the opening in the silicon nitride layer; and
- a conductive metal layer on the barrier metal layer.

13. The gate metal formation according to claim 12, wherein:

the gate metal layer is deposited using reactive evaporation; and the barrier metal layer is deposited using sputtering.

14. The gate metal formation according to claim 12, wherein the gate metal layer comprises at least one of nickel, tungsten, platinum, palladium, and tungsten nitride.

15. The gate metal formation according claim 12, wherein the gate metal layer comprises a first gate metal layer and a second gate metal layer.

16. The gate metal formation according to claim 15, wherein the first gate metal layer is nickel and the second gate metal layer is tungsten.

17. The gate metal formation according to claim 12, wherein the barrier metal layer comprises tungsten nitride.

18. The gate metal formation according to claim 12, further comprising a cap metal layer on the conductive metal layer.

19. The gate metal formation according to claim 12, wherein the substrate comprises a substrate of gallium nitride, aluminum gallium nitride, or a combination of gallium nitride and aluminum gallium nitride.

20. The gate metal formation according to claim 12, wherein the gate metal formation comprises a gate connected field plate (GCFP) formed on the substrate with a width of about 1.1 microns.

* * * * *